(12) United States Patent
Ürgen et al.

(10) Patent No.: US 10,287,700 B2
(45) Date of Patent: May 14, 2019

(54) METHOD FOR BORIDING OF COATINGS USING HIGH SPEED ELECTROLYTIC PROCESS

(76) Inventors: Mustafa K. Ürgen, Istanbul (TR); Servet I. Timur, Istanbul (TR); Kürsat M. Kazmanli, Istanbul (TR); Güldem Kartal, Istanbul (TR)

( * ) Notice: Subject to any disclaimer, the term of this patent is extended or adjusted under 35 U.S.C. 154(b) by 73 days.

(21) Appl. No.: 12/741,592

(22) PCT Filed: Nov. 6, 2008

(86) PCT No.: PCT/EP2008/065065
§ 371 (c)(1),
(2), (4) Date: May 5, 2010

(87) PCT Pub. No.: WO2009/060033
PCT Pub. Date: May 14, 2009

(65) Prior Publication Data
US 2010/0224498 A1    Sep. 9, 2010

(30) Foreign Application Priority Data

Nov. 9, 2007 (EP) .................................... 07120419

(51) Int. Cl.
*C23C 8/68* (2006.01)
*C25D 9/08* (2006.01)
(Continued)

(52) U.S. Cl.
CPC ................. *C25D 9/08* (2013.01); *C23C 8/02* (2013.01); *C23C 8/40* (2013.01); *C23C 14/16* (2013.01);
(Continued)

(58) Field of Classification Search
CPC ..................... C23C 8/68–8/70; C25D 11/028
(Continued)

(56) References Cited

U.S. PATENT DOCUMENTS

| | | | |
|---|---|---|---|
| 3,824,134 A | | 7/1974 | Chance |
| 4,402,764 A | * | 9/1983 | Clark et al. ................... 148/247 |
| 2013/0056363 A1 | | 3/2013 | Timur et al. |

FOREIGN PATENT DOCUMENTS

| | | |
|---|---|---|
| DE | 1796215 A1 | 2/1972 |
| GB | 1422859 A | 1/1976 |

(Continued)

OTHER PUBLICATIONS

"Elements of Induction Heating: Design, Control and Applications", S. Zinn and S. L. Semiatin, Electric Power Research Institute, Inc., p. 3, 1988.*

(Continued)

*Primary Examiner* — Lois L Zheng
(74) *Attorney, Agent, or Firm* — Brooks Kushman P.C.

(57) ABSTRACT

A method for producing a wear and corrosion resistant WC based material coated with one or more metals selected from group IVB, VB and VIB metals (according to CAS system) and Al is disclosed. The method comprises treating of said coated structure with electrochemical boriding treatment in an electrolyte which is substantially free of halogenated compounds wherein the electrolyte comprises alkali carbonates and boron sources and said electrolyte being heated during electrolysis under an induction heating regime having electromagnetic frequency ranging from 50 to 300 kHz during electrolysis.

14 Claims, 4 Drawing Sheets

(51) Int. Cl.

| | |
|---|---|
| *C23C 8/02* | (2006.01) |
| *C23C 8/40* | (2006.01) |
| *C23C 14/16* | (2006.01) |
| *C23C 14/58* | (2006.01) |
| *C25D 3/66* | (2006.01) |
| *C25D 9/04* | (2006.01) |
| *C25D 11/02* | (2006.01) |
| *C23C 28/04* | (2006.01) |
| *C25D 11/00* | (2006.01) |

(52) U.S. Cl.
CPC ...... *C23C 14/5806* (2013.01); *C23C 14/5846* (2013.01); *C23C 28/044* (2013.01); *C23C 28/048* (2013.01); *C25D 3/66* (2013.01); *C25D 9/04* (2013.01); *C25D 11/028* (2013.01)

(58) Field of Classification Search
USPC .......................... 148/217, 279; 205/316, 549
See application file for complete search history.

(56) References Cited

FOREIGN PATENT DOCUMENTS

| | | | |
|---|---|---|---|
| JP | 57-161090 | * 10/1982 | .............. C25D 9/04 |
| JP | 57161090 A | 10/1982 | |
| JP | 2002-180271 A | 6/2002 | |

OTHER PUBLICATIONS

ASTM Handbook, p. 42.

Danek et al., "Thermodynamic and structural aspects of electrochemical deposition of metals and binary compounds in molten salts", Coordination Chemistry Reviews 167(1997) 1-48.

Fastner et al., "Electrochemical deposition of TiB2 in high temperature molten salts", Journal of Alloys and Compounds 452 (2008) 32-35, Feb. 28, 2007.

Jun Li et al., "Preparation of highly preferred orientation TiB2 coatings", Rare Metals vol. 24, No. 2, Apr. 2006, p. 111.

* cited by examiner 35-0741 Titanium Boride          $TiB_2$
15-0617 Boron Aluminum       $AlB_{10}$
22-0002 Aluminum Boron       $AlB_{10}$
39-1483 Aluminum Boron       $AlB_2$

METHOD FOR BORIDING OF COATINGS USING HIGH SPEED ELECTROLYTIC PROCESS

CROSS-REFERENCE TO RELATED APPLICATIONS

This application is the U.S. national phase of PCT Appln. No. PCT/EP2008/065065 filed Nov. 6, 2008, which claims priority to European application 07120419.2 filed Nov. 9, 2007.

TECHNICAL FIELD OF THE INVENTION

The present invention, relates to an improved method of forming hard boride layers on the surfaces of cutting tools, and other working materials, all or part of materials that require corrosion and abrasion resistance. The invention particularly relates to a method of electrochemically forming metal boride layers on the substrate materials that are coated with the material to be borided prior to the boriding process. The coating of the substrate material with metal or alloys to be borided can be conducted by using conventional techniques such as physical vapor deposition, chemical vapor deposition or electroplating.

BACKGROUND OF THE INVENTION

Processes for forming of boride layers on metallic surfaces are known in the art. Boriding takes place by diffusion of boron atoms into a metallic material which has the ability to form boride compounds such as MeB, $Me_2B$ or $Me_xB_y$. The so formed boride layer improves the hardness, abrasion, corrosion, oxidation, and fatigue resistance of the materials.

Boriding can be conducted with different processes by using paste, liquid or gas phase boron source (amorphous or crystalline boron, ferroboron, boron carbide, borax, boric acid, $NaBF_4$ and other boron compounds) and a reducing agent (SiC, FeSi, $B_4C$) at temperatures between 700-1000° C. within a time interval varying between 1-10 hours.

A process that can be used for boriding is electrochemical boriding that is conducted in molten salt electrolytes at temperatures ranging between 700-1100° C. For this process, boron containing electrolytes are used and reduction to boron is achieved through the electrolytic process. However, in these electrolytes generally toxic compounds such as fluorides are needed in order to obtain an acceptable rate of boriding.

Another type of method for forming boride layers on the material surface is conducted through the coating processes such as PVD and CVD. In PVD techniques, a boride material is used as the target material (e.g. $TiB_2$) which may be difficult to process and also expensive. The coatings produced with these methods are having problems of adhesion and high brittleness. In CVD processes boron source is a boron containing gas (such as $BCl_3$) which are highly toxic and expensive. In these cases the boride compound is formed as a separate layer.

A classical electrochemical boriding process is conducted in the presence of activating agents such as alkali fluorides for electrochemically activating the boron compounds. A borided layer thickness of 130 μm is obtained on ferrous metals and alloys within 4-8 hours under the standard heating conditions according to the ASTM Metal Handbook. Decreasing the process duration without concession of the desired coating thickness will obviously provide considerable advantage over the known methods. A further advantage will appear if use of said fluoride compounds is eliminated in the electrolyte solution.

U. Fastner et al., "Electrochemical deposition of $TiB_2$ in high temperature molten salts", *J. Alloys Compd.*, 2007 provides information with regard to such electrolytes having fluorine content (i.e. NaCl—KCl—NaF—$KBF_4$—$K_2TiF_6$). The publication reports that performance of the electrolyte is significantly reduced with the thermal decomposition of the tetrafluoroborates. Further, electrolytes containing for instance LiF—NaF—KF are disclosed by Jun et al., "Preparation of highly preferred orientation $TiB_2$ coatings", *RARE METALS*, vol. 25, No. 2, p. 111, 2006 wherein effect of the current frequency and density on the formation of the $TiB_2$ coating is evaluated. An overall review of the electrolyte solutions having fluoride content for electrochemically activating the boron species has been reported by V. Danek et al., "Thermodynamic and structural aspects of electrochemical deposition of metals and binary compounds in molten salts", *Coordination Chemistry Revies*, 1997. The non-patent literature aims to improve the electrolyte performance in general, however none of the cited documents suggests eliminating use of said fluorinated compounds and the problems associated thereto.

In the presence of the fluorinated compounds as per addressed above, performance of the electrolyte significantly decreases particularly in boriding processes because of the thermal decomposition, and boron-fluoride or alkali-fluoride gas emission. On the other hand, omitting said compounds from the electrolyte solutions reduces electrochemical activation of boron which leads low yielded boron diffusion. Any person in the field would also appreciate the drawbacks of said gas emissions in terms of the environmental aspects. The present invention eliminates use of said fluorinated activator compounds by means of conducting electrochemical boriding in a high frequency induction heating system and providing a unique electrolyte composition.

JP 57161090 discloses a method for boriding a structural material wherein an abrasion wear resistant surface is obtained by coating one or two of the elements selected from IVA, VA and VIA groups. $Na_2B_4O_7$ is used as the boron source and DC electrolysis is applied in the electro-deposition medium. The method bears the standard drawbacks in terms of process duration as exemplified above with reference to the ASTM Metal Handbook. The method does not refer to any solution for above problems, and does not mention about high frequency induction heating of the electrolytic salt medium which may accelerate the boron diffusion as in the present invention.

GB 1,422,859 discloses a similar process for hardening a metal or alloy work, the process comprising the steps of: a) "covering" the metal work with a molten layer of a treating material selected from boron oxide and borates, and optionally elements of groups IVB, VB and VIB (according to the CAS-system); b) transferring heat to said molten layer to maintain the same at a temperature from 700° C. to 1200° C.; c) introducing an inert anode into said molten layer and passing electric current at a current density of at least 0.5 A/cm² through said work and molten layer until the surface region of said work is permeated with boron with or without said elements. Apparently, boron diffusion starts in step c) after passing an electric current for electrolyze. Heating means (e.g. high frequency induction) are needed to be used solely in the process steps a) and b) for better "covering" with the molten treating material. However, the disclosure does not accept supplemental heating as a requirement for boron diffusion in the case of electrolysis of step c) as understood from the description (page 4, lines 101-103). This is because great amount of heat is produced during electrolysis which renders an additional heat supply unnecessary. According to the explanations heat is supplied only for the purpose of heating the medium in steps a) and b) but not for increasing the boron diffusion. In other words, the document is silent about the surprising effect provided with high frequency induction heating during boron diffusion, heating means are used solely for heating purposes, and the disclosure even excludes the use of such heating means during electrolysis perceiving it as unnecessary.

U.S. Pat. No. 3,824,134 discloses a method for producing hard metallic boride layers comprising carburizing of a ferrous metal substrate and then coating this surface with a metal that has high affinity for carbon (e.g. Cr). This layer forms an impervious carbide layer during heating thus eliminating diffusion of iron into this layer during boriding. Hence, this study mainly aims to eliminate ferrous boride formation within the boride layer. Eventually, the patent disclosure deals with different problems other than those of the present invention.

DE 1 796 215 discloses boriding of metals, particularly boriding of steel, using ferroboron, amorphous boron, boron carbide or borax as boron precursors, with fluoroborate as an activator agent. Despite the description addresses the use of high frequency induction heating for boriding methods conducted in aqueous solutions as well as in the paste boriding treatments, disclosure is still silent for providing solutions to the problems posed in the present invention. First of all, the procedure is mainly designed for boriding of ferrous metals or alloys, and does not bring solutions associated with boronization of non-ferrous metallic structures. On the other hand, using of induction heating regime in the mentioned type aqueous solutions (not in the molten salts) indicates that such heating regime is solely used for heating of metals to high temperatures and this is given only for general information. The information regarding use of a high frequency inductor in a paste boriding procedure is technically irrelevant with the electrolytic processes conducted in molten salts. Disadvantage of this process is that particles from boriding agent are welded on the metal surface rendering the surface characteristics very poor, hence high frequency induction heating becomes unsuitable for this process (Page 3, second paragraph). Furthermore, the process disclosed in the specification strictly requires use of the halogenated compounds (I.e. $KBF_4$) which are eliminated with the process disclosed in the present invention.

In relation to the above findings, there is still need for an improved method of electrochemical boriding in order to overcome these problems. These drawbacks of the known methods are eliminated by the electrochemical process of claim 1.

OBJECTS OF THE INVENTION

One of the objects of the present invention is to provide an electrochemical boriding method wherein use of fluorinated and other halogenated compounds in the electrolyte is eliminated.

Another object of the present invention is to reduce the duration of a boriding process and increase the boron diffusion rate through the structural element to be borided.

A further object of the invention is to provide a boriding method in which a multilayer structure consisting substantially of MeB, $MeB_2$, MeB+$MeB_2$ layers is provided.

Still a further object of the invention is to provide an electrochemical boriding method wherein adherence of the electrolyte molten salts onto the treated article at the end of the boride treatment process is eliminated.

Another object of the invention is to provide an electrochemical process having possibility of quick electrochemical boriding of alloys and intermetallics.

Still another object of the invention is to provide an electrochemical boriding process wherein controlled cooling rate of the treated materials after the boriding process is provided.

These and other objects of the invention will be apparent to those skilled in the art in light of the following description and appended graphs.

DETAILED DESCRIPTION OF THE INVENTION

Figure 1:
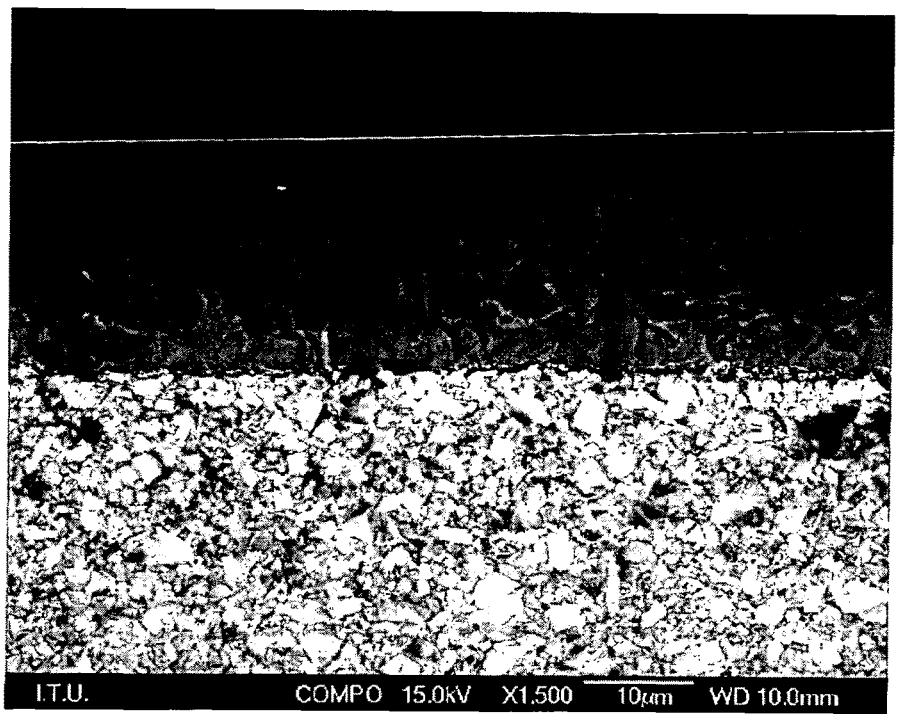
FIG. 1 is the SEM micrograph of a borided Ti coated WC working tool which is subjected to 15 min. of electrochemical boriding process according to the present invention.

The present invention is directed to an improved electrochemical process for boriding metallic structural elements that are deposited on substrates by using suitable deposition processes such as CVD and PVD. The invention particularly relates to a method for providing borides of metals selected from the group consisting of group IVB, VB, VIB metals and Al. The method disclosed herewith provides also borides of alloys selected from above metals. Borides of titanium are particularly preferred.

The method of the invention is suitable to form boride layers on metallic structures as defined above. These metallic structures are produced in the form of a coating on a base material such as WC or WC—Co which materials are conventionally used in cutting, forming, drawing, drilling, milling or abrasive tools. These tools are subjected to extreme thermal and wear stress and are expected to provide long service life under severe mechanical conditions.

In one embodiment of the present invention, a metallic or nonmetallic base material as defined above is initially coated with a metal or group of metals having ability of forming boride layers. Said metal or group of metals are selected from group IVB, VB, VIB metals, and Al or alloys thereof. Coating process may be conducted by any conventional method such as CVD or PVD. The inventors obtained best results by using arc-PVD. The structural element coated with a selected metal as indicated is later on subjected to an electrochemical boriding process. Boron atoms diffuse through said coated metal or alloy and forms $MeB_x$ layers which improve abrasion, corrosion, oxidation and cutting performance of the material. These boron layers are preferably arranged from surface through base material in the form of a simple B—$MeB_x$-Me arrangement. Inventors surprisingly found that when high frequency induction is used for heating and melting of the electrolyte, the boron diffusion rate in the electrochemical boriding process significantly increases. This advantage obviously reduces the process time necessary to achieve a desired thickness of the boride layer on a substrate.

The inventors also found out that application of high frequency induction heating provides a further surprising advantage in terms of the electrolyte used in the process. Conventional electrolyte solutions for use in electrochemical boriding generally contain molten salts of boron compounds as the boron sources along with activator agents such as halogenides. Fluorine is mostly preferred in said boron compounds (e.g. $KBF_4$) and halogenides (e.g. NaF, LiF, KF) for electrochemically activating boron and promoting formation of $MeB_x$ phases. However fluorine, due to its well known corrosive nature, promotes corrosion of the equipment inside an electrolysis medium. Further, melts containing tetrafluoroborates of alkali metals are known to undergo thermal decomposition according to the following reaction:

$$KBF_4 \rightarrow KF + BF_3(g)$$

Poisonous nature of fluorine and its gaseous boron compounds is another drawback of the conventional electrolytes. Due to the above defined thermal decomposition, electrolyte performance dramatically decreases. Inventors surprisingly found that prior art electrolytes, whether or not the auxiliary halogenides are absent in the medium, give better performance in the coating process in which the electrolyte is heated within a high frequency induction furnace. Under electromagnetic high frequency induction heating, it was observed that formation rate of the boride layer on a substrate is at least 4 times faster than that of the conventional methods even in the absence of said halogenide activators.

Induction heating is known with its use in metalworking fields such as soldering, tempering and annealing of metals. The unexpected effect of the high frequency heating regime in a boriding method would be attributed to the fact that low frequency induction is tending to heat whole article while high frequency induction heating is tending to heat substantially only surface of the treated article. This local heating behavior of the high frequency prevents the electrolyte from being decomposed, thus this method of heating considerably increases the electrolyte performance. Furthermore, this heating regime provides homogenous temperature profile within the electrolyte and forces it to move around which prevents the formation of "concentration areas" on the treated article. Accordingly, diffusion controlled boriding is considerably increased which renders the above defined fluorinated compounds completely unnecessary. A preferred induction heating profile is obtained in the temperature range of 700-1100° C. and in the frequency range of 50-300 kHz, more preferably in the range of 70 to 150 kHz. Preferred current density is in the range of 250 to 600 $mA/cm^2$.

The present invention provides also a specific electrolyte suitable for the realization of the objects defined above. A particular electrolyte solution comprises alkali carbonates and alkali borates free of halogenides, particularly free of fluorine in the electrolyte. Amount of the carbonates in the electrolyte is preferably ranging from 1% to 30% whereas said borates are preferably ranging from 70% to 99% (w/w). Such an electrolyte does not contain any compound that can become volatile at temperatures used for electrochemical boriding .The specified molten electrolyte solution is readily cleaned from the article surface after the boriding which in turn is generally a well known problem for the conventional electrolytes.

Further advantages and specific details of the invention will be more apparent for those skilled in the art in light of the following examples which are given solely for illustration without limiting the invention to any specific embodiment.

EXAMPLE 1

Figure 2:
FIG. 2 is the ×3500 SEM micrograph of the image shown in FIG. 1.
Figure 3:
FIG. 3 is a combined SEM and linescan image of a borided Ti coated WC working tool which is subjected to 15 min. of electrochemical boriding process according to the present invention.
Figure 4A:
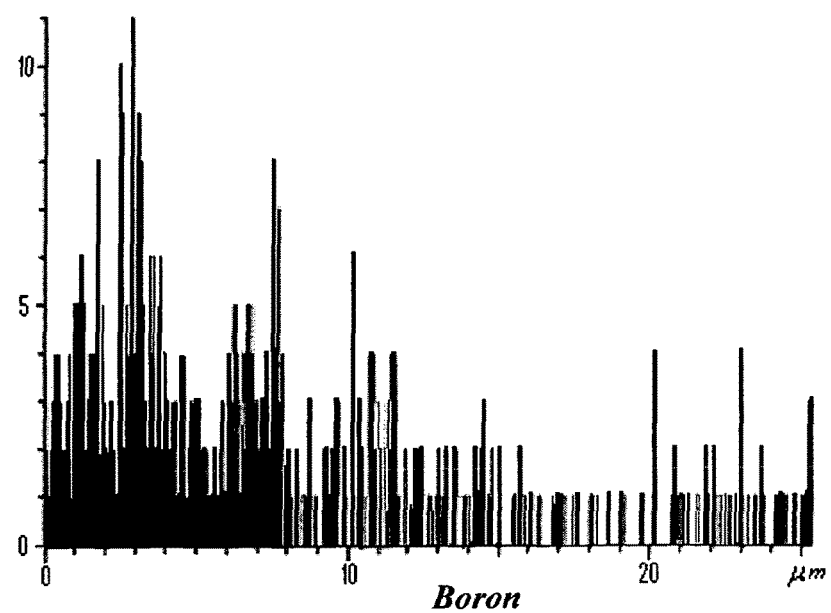
FIGS. 4A, 4B and 4C are the linescan analysis graphs indicating the variation of boron, titanium and tungsten species respectively.
Figure 4B:
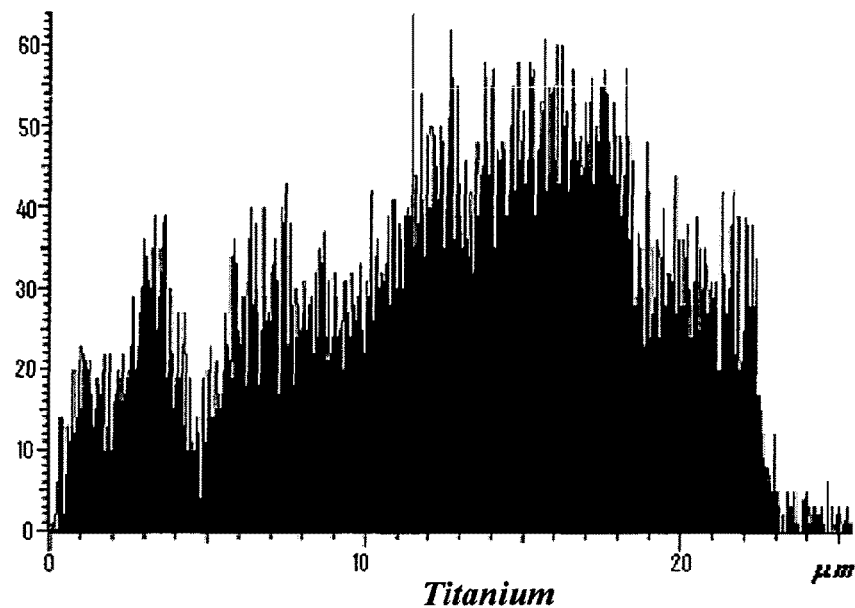
Figure 4C:
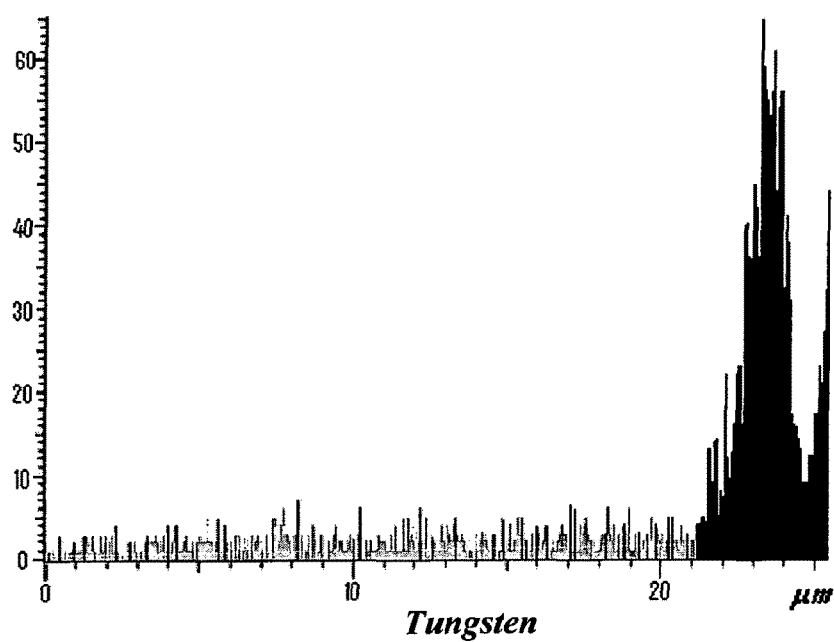

A cutting bit made of tungsten carbide (WC) was coated with a Titanium layer by physical vapor deposition. Thickness of the layer was adjusted to be approximately in the range of 15-20 μm. Titanium coated article was then placed into an electrochemical boriding apparatus wherein the article to be borided was treated as cathode and a graphite crucible was treated as the anode. The electrolyte composition was comprising 10% $Na_2CO_3$ and 90% $Na_2B_4O_7$ (w/w). An induction heating apparatus was used for heating the electrolysis medium to 950° C. in which the frequency was adjusted to 150 kHz. Applied current density was 300 $mA/cm^2$. Boriding procedure was stopped after 15 minutes. SEM micrograph images in FIGS. 1 and 2, a combined SEM and linescan image in FIG. 4 and linescan analysis graphs in FIGS. 4A, 4B and 4C showed that a layer consisting of $TiB_x$ is formed through the 15-20 μm thickness within 15 minutes.

EXAMPLE 2

An identical sample made of WC as defined in example 1 was coated with titanium by using PVD and electrochemical boriding process of example 1 was followed with the exception that frequency of the induction heating was reduced to an intermediate level of 30 kHz. Formation of a layer consisting of $TiB_x$ having 6 μm thickness was observed.

EXAMPLE 3

Figure 5:
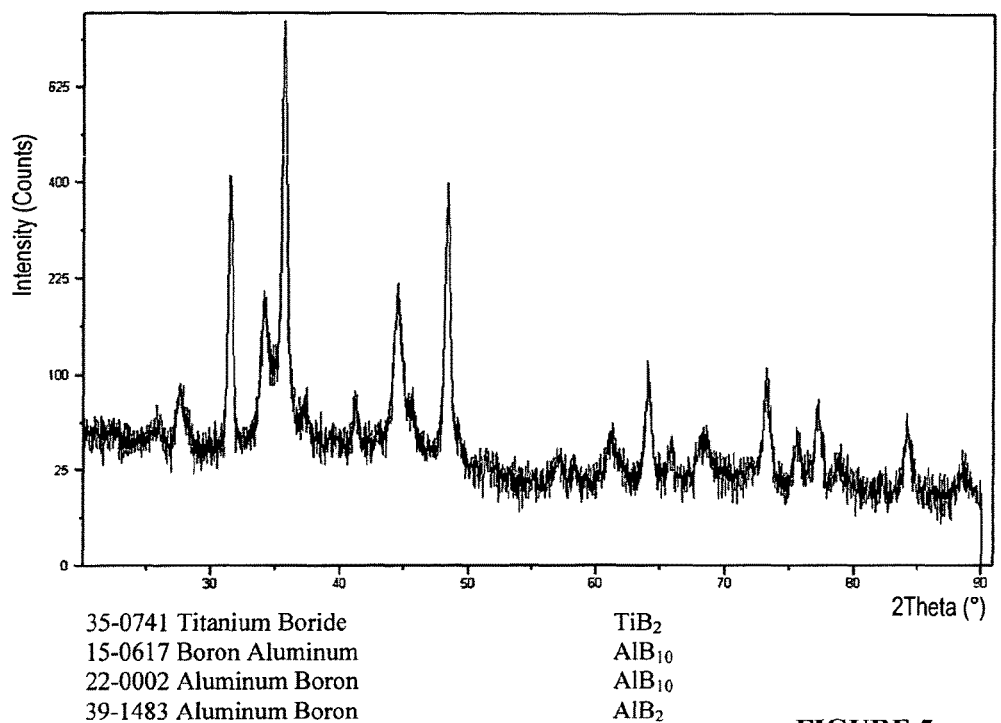
FIG. 5 is an X-ray diffraction pattern of the coating layer consisting of boron compounds of titanium and aluminum.
Figure 6:
FIG. 6 is a SEM micrograph of the coating layer consisting of boron compounds of titanium and aluminum.

An identical sample made of WC as defined in example 1 was coated simultaneously with titanium and aluminum by PVD. Boriding process of example 1 was exactly followed. It was observed that both titanium and aluminum species formed boride layers through the whole depth of the 20 μm thickness. X-ray diffraction pattern and SEM micrograph of the coating layer indicate the presence of said boride layers as shown in FIGS. 5 and 6.

Experimental studies show that relatively high frequency levels, e.g. above 70 kHz applied in the induction heating chamber significantly increases boron diffusion rate compared to that of the boriding procedures having low frequency heating profiles. Example 3 particularly reveals the possibility of boriding multi metal structures, for instance a structure consisting of titanium-aluminum. The inventors report that electrolyte solution had substantially no indication of evaporation of electrolyte compounds even in longer durations of electrolysis. The inventors do also report that boron diffusion within a thickness of 200-250 μm is readily achieved in just two hours according to the principles of the invention outlined above. Considering the relatively longer process times of the prior art (130 μm of thickness is achieved within 4-8 hours, according to *ASTM Metal Handbook*), a skilled person in the field would appreciate the advantageous features of the invention with respect to the environmental and economical point of view.

The invention claimed is:

1. A method for producing a wear and corrosion resistant coated structure, including:
   coating a WC based material with one or more metals selected from group IVB, VB and VIB metals and Al using physical vapor deposition (PVD) to form a coated structure including a WC based material substrate having a PVD metal coating layer thereon; and
   treating said coated structure with electrochemical boriding in an electrolyte that comprises alkali carbonates and boron sources and which is substantially free of halogenated compounds, and melting the electrolyte with a high frequency induction heating regime having electromagnetic frequency of between 50 kHz and 300 kHz and maintaining the high frequency induction regime during the electrochemical boriding process;
   performing the electrochemical boriding and high frequency induction heating processes to convert at least a portion of the PVD metal coating layer into a multilayer $MeB_x$ structure including layers selected from MeB, $MeB_2$, MeB+$MeB_2$, and $MeB_x$, wherein Me is the one or more metals coated by PVD, and wherein electrochemical boriding is conducted under a current density of 300 mA/cm$^2$.

2. A method according to claim 1, wherein the WC based material is substantially consisting of WC or WC—Co.

3. A method according to claim 1, wherein boron sources are selected from boric acids and alkali borates.

4. A method according to claim 1, wherein boron sources are selected from $H_3BO_3$ and $Na_2B_4O_7$.

5. A method according to claim 1, wherein the alkali carbonate is $Na_2CO_3$.

6. A method according to claim 1, wherein an amount of the alkali carbonate ranges from 1% to 30% and an amount of the boron sources range from 70% to 99% (w/w) based on the total weight of the electrolyte.

7. A method according to claim 1, wherein said electromagnetic frequency of the induction heating regime ranges from 70 to 150 kHz.

8. A method according to claim 1, wherein said metal is selected from the group consisting of Ti, Hf, Zr and Al.

9. A method according to claim 1, wherein the electrochemical boriding is conducted at a temperature ranging from 700° C. to 1100° C.

10. A method according to claim 1, wherein a surface of said coated structure is also heated by the high frequency induction heating regime.

11. A method according to claim 1, wherein the multilayer structure includes a layer of $MeB_x$.

12. A method according to claim 1, wherein the electrochemical boriding and high frequency induction heating regime convert an entire thickness of the PVD metal coating layer into the multilayer structure.

13. A method for producing a wear and corrosion resistant coated structure, including:
   coating a metallic structure with one or more metals selected from group IVB, VB and VIB metals and Al using physical vapor deposition (PVD) to form a coated structure including a metal substrate having a PVD metal coating layer thereon; and
   treating said coated structure with electrochemical boriding in an electrolyte that comprises alkali carbonates and boron sources and which is substantially free of halogenated compounds, and melting the electrolyte with a high frequency induction heating regime having electromagnetic frequency of between 50 kHz and 300 kHz and maintaining the high frequency induction regime during the electrochemical boriding process;
   performing the electrochemical boriding and high frequency induction heating processes to convert at least a portion of the PVD metal coating layer into a multilayer $MeB_x$ structure including layers selected from MeB, $MeB_2$, MeB+$MeB_2$, and $MeB_x$, wherein Me is the one or more metals coated by PVD, and wherein electrochemical boriding is conducted under a current density of 300 mA/cm$^2$.

14. The method according to claim 13, wherein the electrochemical boriding and high frequency induction heating are performed until an entire thickness of the PVD metal coating layer is converted into the multilayer structure.

* * * * *